(12) United States Patent
Lee et al.

(10) Patent No.: US 6,620,690 B2
(45) Date of Patent: Sep. 16, 2003

(54) METHOD OF FABRICATING FLASH MEMORY DEVICE USING SELF-ALIGNED NON-EXPOSURE PATTERN FORMATION PROCESS

(75) Inventors: Jae-han Lee, Seoul (KR); Dae-youp Lee, Kunpo (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/196,128

(22) Filed: Jul. 17, 2002

(65) Prior Publication Data

US 2003/0022439 A1 Jan. 30, 2003

(30) Foreign Application Priority Data

Jul. 26, 2001 (KR) ........................................ 2001-45223

(51) Int. Cl.[7] ............................................. H01L 21/336
(52) U.S. Cl. ..................................................... 438/268
(58) Field of Search ................................ 438/268, 258, 438/780, 947

(56) References Cited

U.S. PATENT DOCUMENTS 6,037,223 A * 3/2000 Su et al. ..................... 438/257

\* cited by examiner

Primary Examiner—Richard Elms
Assistant Examiner—Beth E. Owens
(74) Attorney, Agent, or Firm—Volentine Francos, PLLC

(57) ABSTRACT

A method of fabricating a flash memory device uses a self-aligned non-exposure pattern formation process. A conductive layer and an oxidation-blocking layer are formed on a stepped pattern including a floating gate pattern and an inter-gate insulating layer pattern such that the conductive layer and the oxidation-blocking layer conform to the stepped pattern. A photoresist layer is formed on the oxidation-blocking layer such that the photoresist layer has an upper surface situated above the oxidation-blocking layer. A portion of the photoresist layer is dissolved, without having photo-exposed the photoresist layer, by soaking the photoresist layer in developing solution. This soaking alone, or supplemented with an etch back process, is carried out until the upper surface of the photoresist layer is situated below the upper surface of the oxidation-blocking layer on the stepped pattern. The resulting photoresist pattern exposes that part of the oxidation-blocking layer on the stepped pattern. A blocking layer pattern exposing the conductive layer is formed on the stepped pattern by removing the exposed part of the oxidation-blocking layer. The photoresist pattern is then removed. A hard mask defining a control gate is formed by oxidizing the surface of the conductive layer exposed by the blocking layer pattern. The blocking layer pattern is then removed. A control gate is formed by etching the conductive layer using the hard mask as an etch mask. The hard mask is then removed whereupon a stacked gate structure is formed.

27 Claims, 16 Drawing Sheets

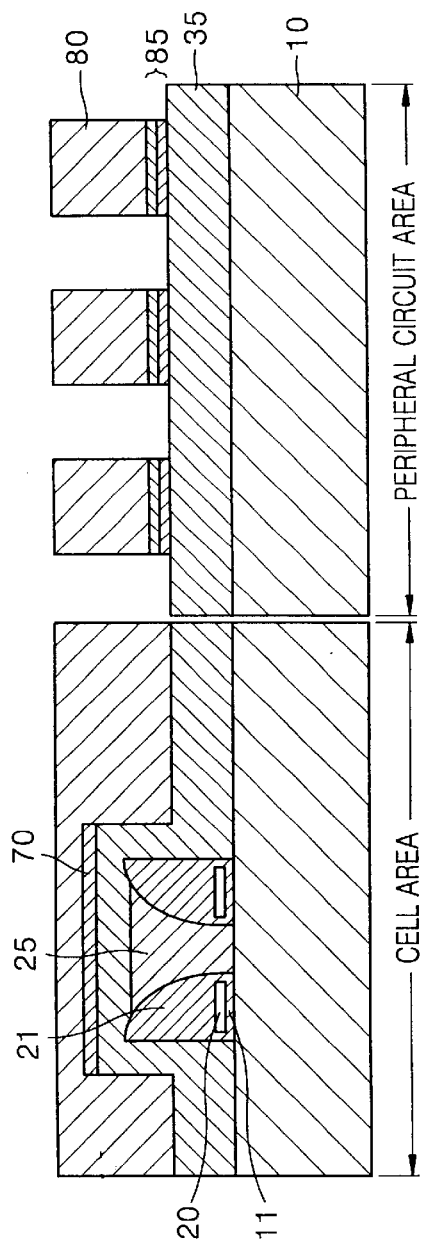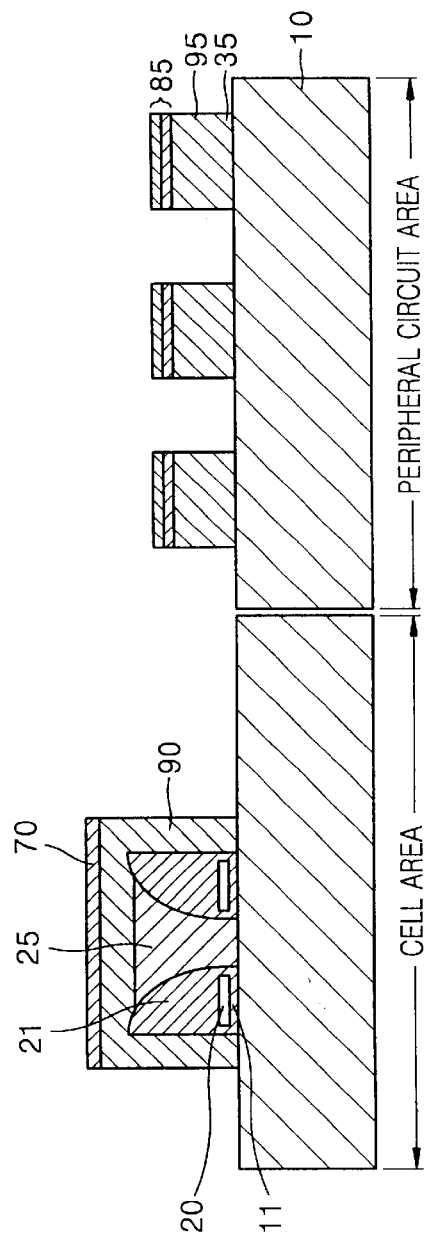

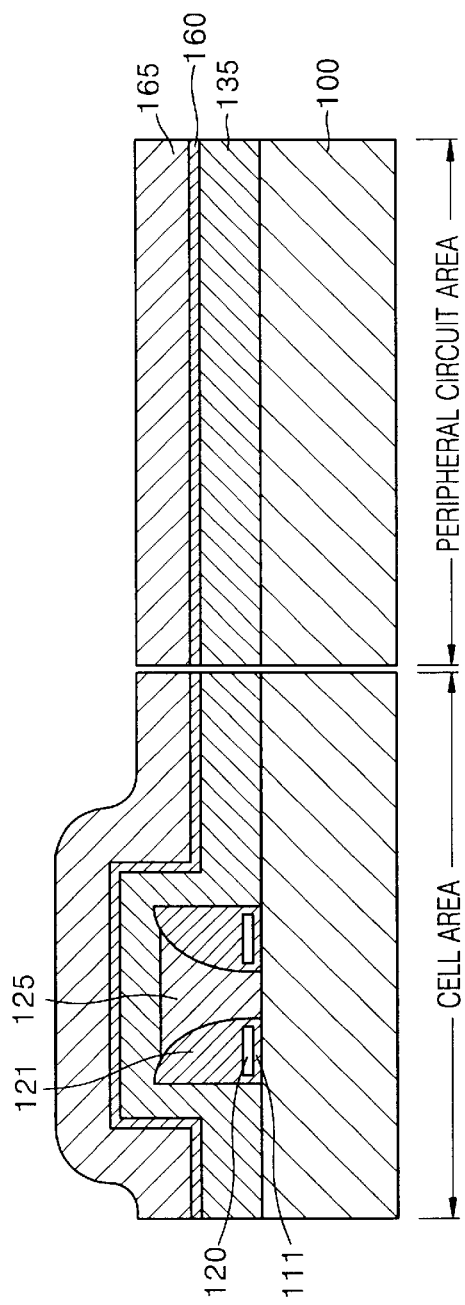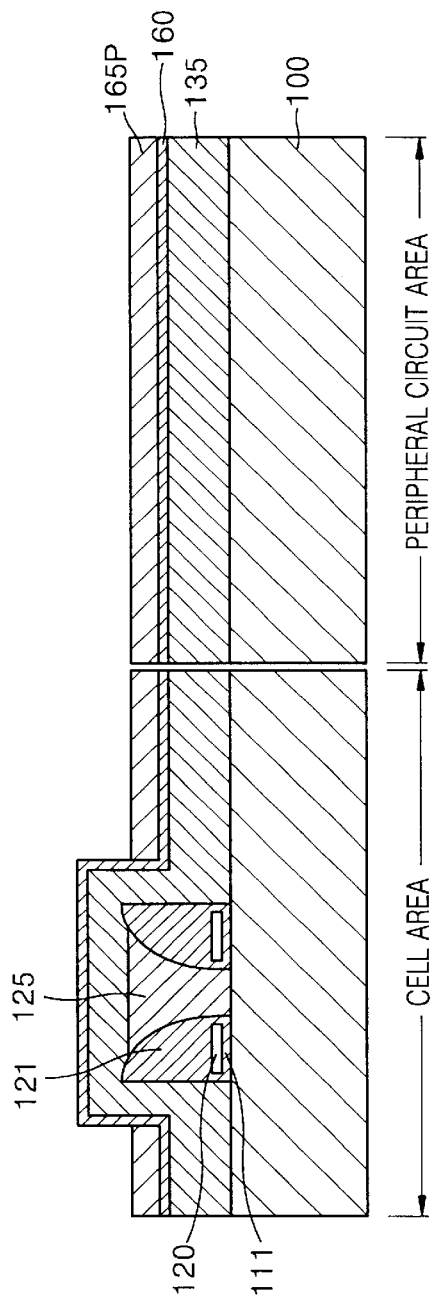

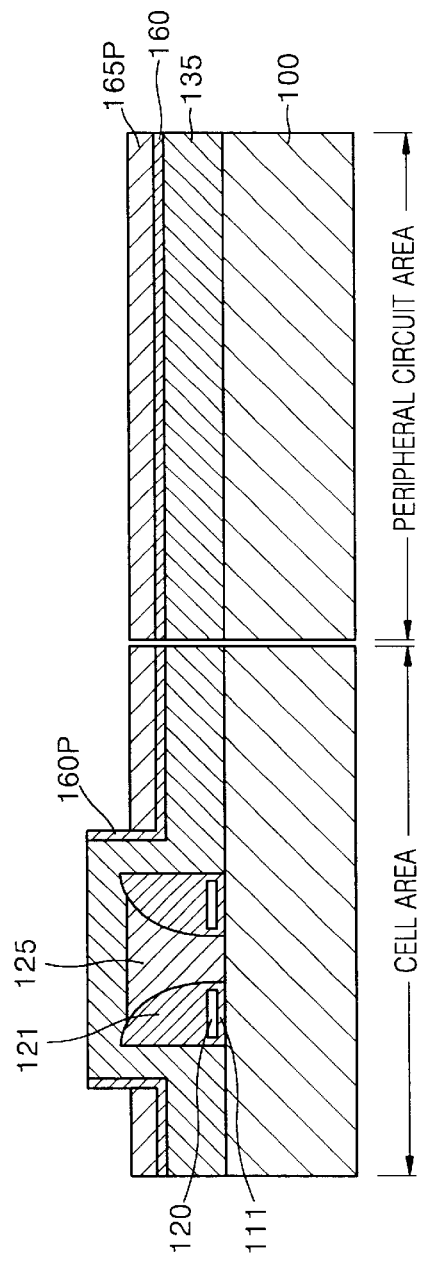
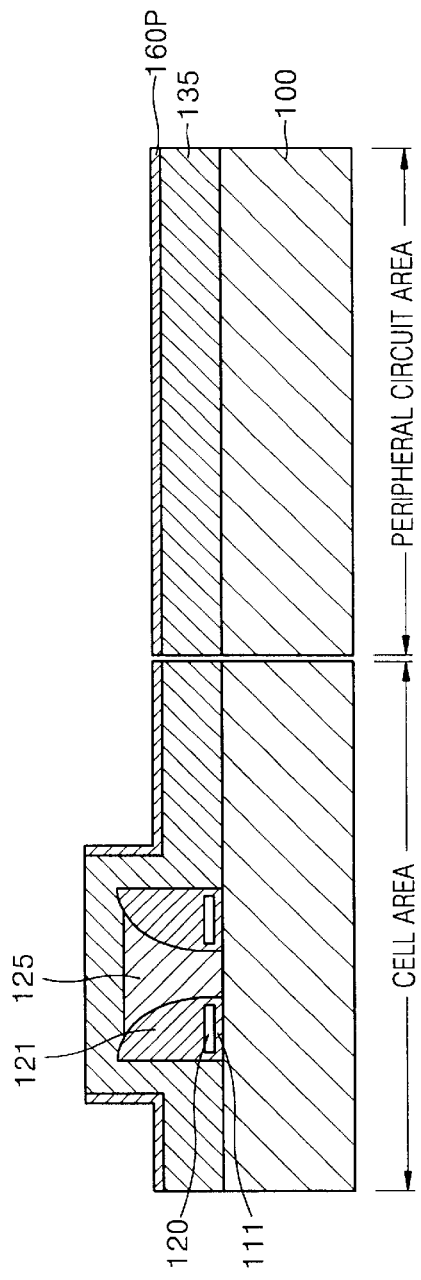

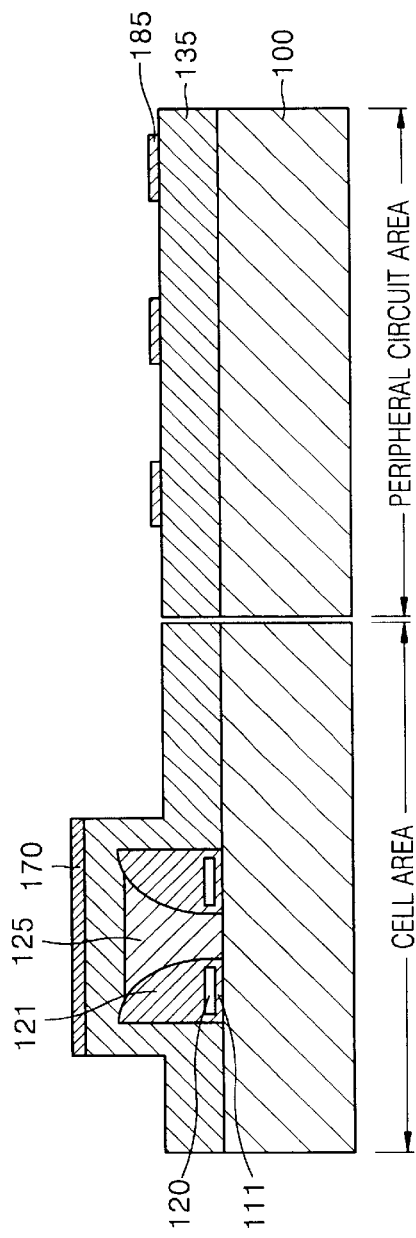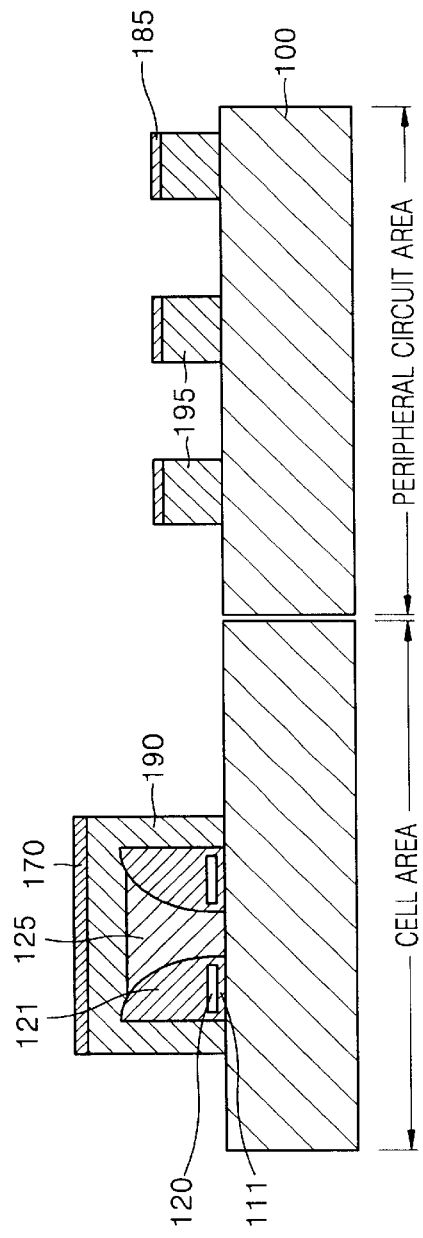

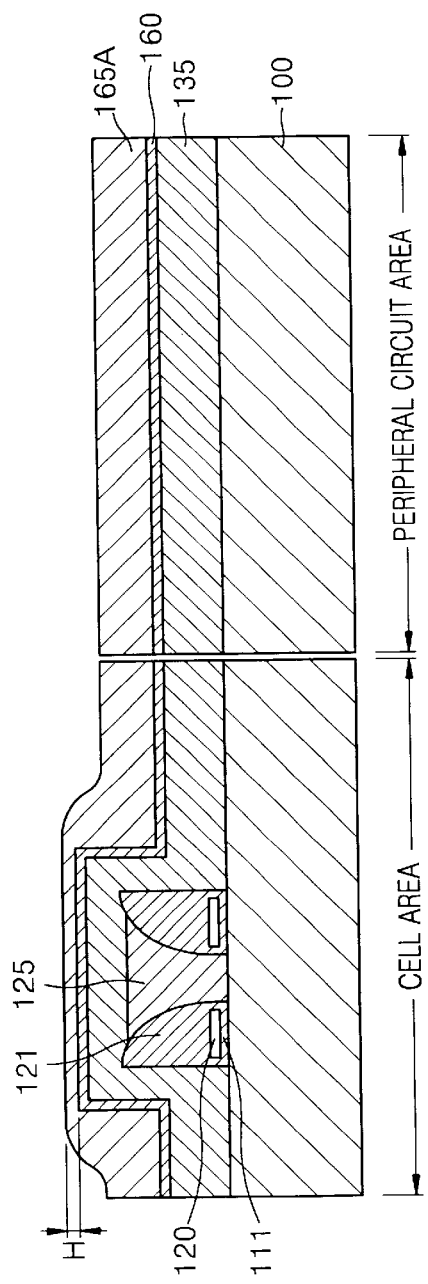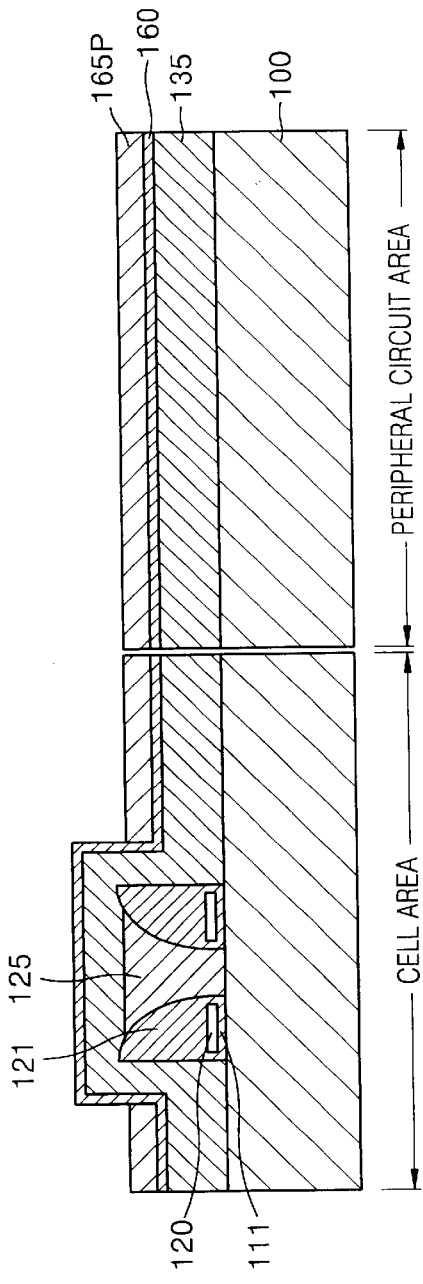

METHOD OF FABRICATING FLASH MEMORY DEVICE USING SELF-ALIGNED NON-EXPOSURE PATTERN FORMATION PROCESS

BACKGROUND OF THE INVENTION

1. Field of the Invention

The present invention relates to a method of fabricating a semiconductor device. More specifically, the present invention relates to a method of fabricating a self-aligned gate pattern of a flash memory device.

2. Description of the Related Art

As the integration density of flash memory devices increases, the stacked gate patterns of the devices are becoming smaller. Recently, a self-aligned pattern formation process that includes chemical mechanical polishing (CMP) has been used to manufacture the stacked gate structures.

The self-aligned process will be described with reference to the flowchart of FIG. 1 and the cross-sectional views of FIGS. 2 through 9. FIGS. 2–9 show a substrate 10 divided into a cell area and a peripheral circuit area. A pad oxide layer 11, a floating gate 20, an inter-gate insulating layer 21, and a common source line 25 are formed in the cell area.

In step 1, a conductive layer 35, an anti-reflective layer 40, and an oxide layer 45 are sequentially formed on the entire surface of the substrate 10 (FIG. 2).

Next, a photolithography process is performed to leave the oxide layer 45 only in the peripheral circuit area. More specifically, in step 2, a photoresist pattern 50 for masking the peripheral circuit area is formed, and then the oxide layer 45 and the anti-reflective layer 40 in the cell area are removed, as shown in FIG. 3.

In step 3, a nitride layer 60 serving as an oxidation blocking layer is formed on the entire surface of the substrate 10 to a thickness of about 1500 Å (FIG. 4). Next, in step 4, the portion of the surface of the conductive layer 35 above the floating gate 20 and the common source line 25 is exposed by CMP, as shown in FIG. 5.

An oxidation process is then performed in step 5. As a result, as shown in FIG. 6, an oxide layer 70 is formed only on the exposed portion of the conductive layer 35, i.e., is not grown on the portion covered by the nitride layer 60. The oxide layer 70 forms a hard mask, for use in forming a control gate, when the nitride layer 60 is removed (step 6 as shown in FIG. 7). In other words, the hard mask 70 is formed by self-aligned CMP and an oxidation process.

Hard masks 85 are then formed in the peripheral circuit area (step 7). In particular, the entire surface of the substrate 10 is coated with a photoresist. Next, photoresist patterns 80 defining gate patterns are formed in the peripheral circuit area by an exposure and development process. The hard masks 85 are formed by etching the oxide layer 45 and the anti-reflective layer 40 remaining in the peripheral circuit area using the photoresist patterns 80 as an etch mask, as shown in FIG. 8.

The photoresist patterns 80 are then removed. Next, the conductive layer 35 formed in step 1 is etched using the hard mask 70 in the cell area and the hard masks 85 in the peripheral circuit area as an etch mask, to form a control gate 90 in the cell area and gates 95 in the peripheral circuit area (step 8, as shown in FIG. 9). Accordingly, a stacked gate structure is formed in the cell area.

In the prior art described above, forming the control gate by a self-aligned method makes it easy to then form a very small stacked gate structure. However, the CMP process used in this method presents several problems. In the case where the nitride layer 60, i.e., the oxidation-blocking layer, is chemically mechanically polished, the conductive layer 35 can be over-etched. When this occurs, the resistance of the gates increases. Also, CMP requires complicated apparatus including a slurry spraying system, CMP polishing mechanisms, a CMP stopping point detecting apparatus, a waste chemical material removing system, and a cleaning apparatus. Still further, a large amount of chemicals (slurry), a pad, and other items are used up and hence, must be replenished, in CMP. Accordingly, CMP is a costly process to implement and perform. Also, a photolithography process for exposing the cell area must be performed before CMP, thereby complicating the process of fabricating the flash memory device.

SUMMARY OF THE INVENTION

An object of the present invention is to solve the above-described problems and limitations inherent in the prior art. More specifically, it is an object of the present invention to provide a method of fabricating a highly integrated flash memory device that is relatively easy to execute using a simple manufacturing system.

The method of fabricating a flash memory device according to the present invention comprises a self-aligned non-exposure pattern formation process. A conductive layer and an oxidation-blocking layer are formed on a stepped pattern including a floating gate pattern and an inter-gate insulating layer pattern such that the conductive layer and the oxidation-blocking layer conform to the stepped pattern. A photoresist layer is formed on the oxidation-blocking layer, whereby the photoresist layer has an upper surface situated above the oxidation-blocking layer. A portion of the photoresist layer is dissolved by soaking the photoresist layer in developing solution. The upper surface of the photoresist layer is brought below the upper surface of that part of the oxidation-blocking layer on the stepped pattern, without having photo exposed the photoresist layer. The resulting photoresist pattern exposes part of the oxidation-blocking layer. A blocking layer pattern exposing the conductive layer is formed on the stepped pattern by removing the exposed part of the oxidation-blocking layer. The photoresist pattern is then removed. A hard mask defining a control gate is formed by oxidizing the surface of the conductive layer exposed by the blocking layer pattern. The blocking layer pattern is then removed. A control gate is formed by etching the conductive layer using the hard mask as an etch mask. A stacked gate structure is formed once the hard mask is removed.

Preferably, the photoresist layer is removed by soaking the layer in a developing solution until the height or thickness of the photoresist layer is equal to or less than 10% of that of the portion of the conductive layer disposed over the stepped pattern, and then etching back the photoresist layer remaining on the stepped pattern. The height of the photoresist pattern is 20–90% of the height of the conductive layer on the stepped pattern.

A nitride layer is formed to a thickness of 50–100 Å or an oxynitride layer is formed to a thickness of 50–600 Å to form the oxidation blocking layer.

The photoresist layer is preferably formed of photoresist including a first novolak resin and a photoactive compound of 3–15 wt % based on the total weight of the first novolak resin, or of photoresist including a first novolak resin, a second novolak resin of 10–60 wt % based on the total weight of the first novolak resin and having a rate of dissolution in the developing solution of 300–1500 Å/sec, and a photoactive compound of 15–30 wt % based on the total weight of the first novolak resin, or of photoresist including a first novolak resin, polyhydroxystyrene of 10–60 wt % based on the total weight of the first novolak resin, and a photoactive compound of 15–30 wt % based on the total weight of the first novolak resin.

The photoresist layer may also be formed of photoresist including a polymer, in which a t-butyloxycarbonyl group and an acetal group are combined with a backbone of the polymer as a protecting group, and a photoacid generator of 0.5–8 wt % based on the total weight of the polymer. In this case, the photoresist layer is preferably baked before being soaked in the developing solution. The baking may be performed in a single stage at 130–160° C. for 30–120 seconds or in a first baking stage at 90–120° C. for 30–120 seconds followed by a second stage at 130–160° C. for 30–120 seconds.

BRIEF DESCRIPTION OF THE DRAWINGS

The above and other objects, features and advantages of the present invention will become more apparent from the following detailed description of the preferred embodiments thereof made with reference to the attached drawings, of which:

FIGS. 2 through 9 are cross-sectional views of the flash memory device under manufacture, during each step of the method shown in FIG. 1;

FIGS. 11 through 18 are cross-sectional views of a flash memory device under manufacture, during each step of the method shown in FIG. 10;

FIGS. 19 and 20 are cross-sectional views of a flash memory device under manufacture, during respective steps of a second embodiment according to the present invention;

DETAILED DESCRIPTION OF THE PREFERRED EMBODIMENTS

Figure 1:
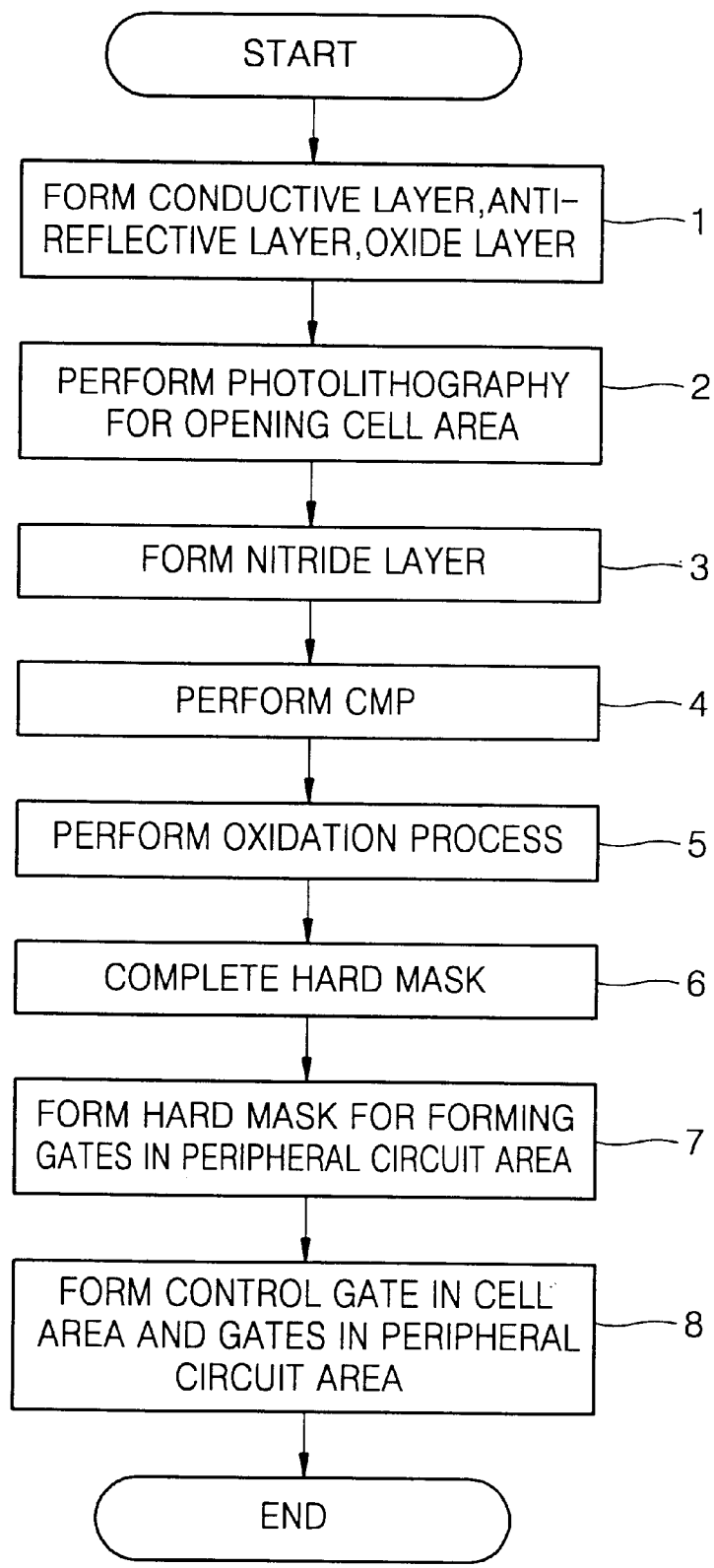
FIG. 1 is a flowchart of a method of fabricating a flash memory device according to the prior art.
Figure 2:
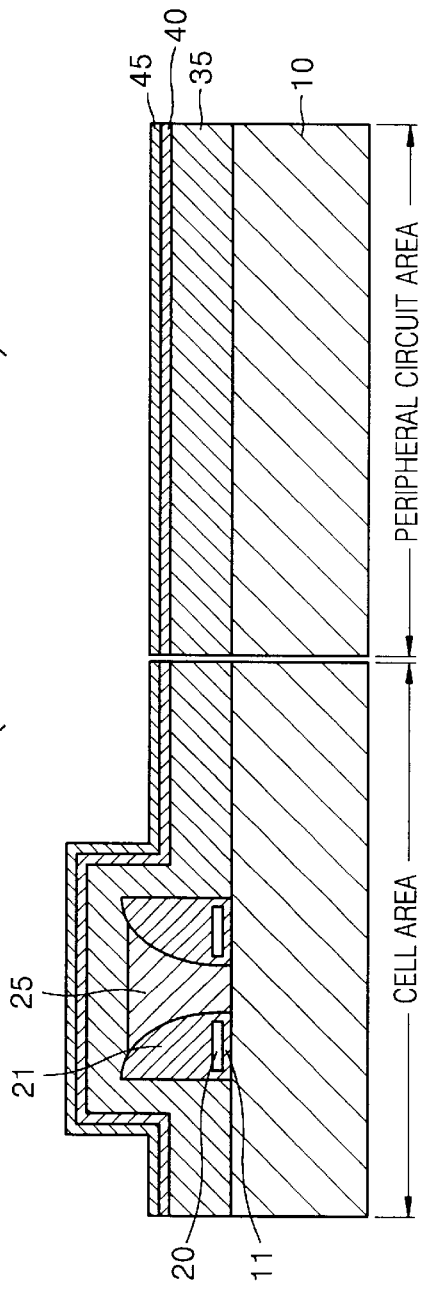
Figure 3:
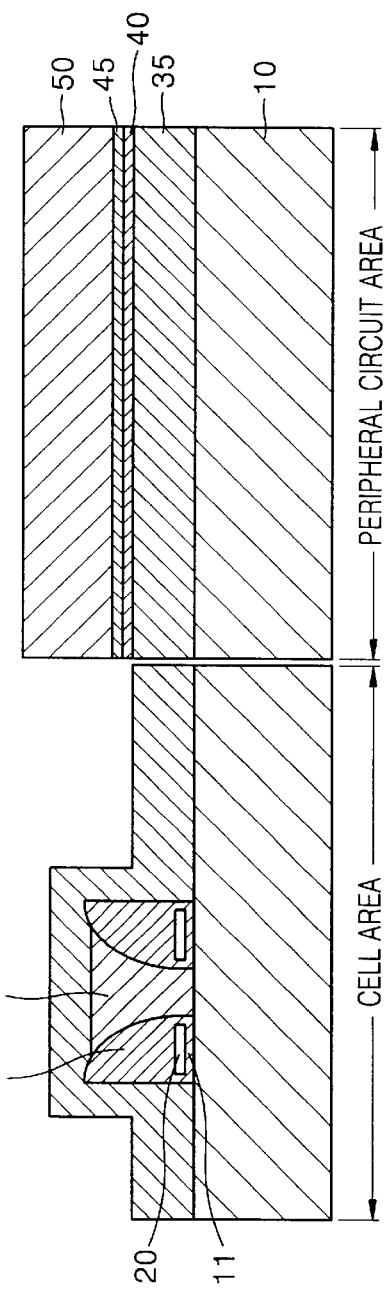
Figure 4:
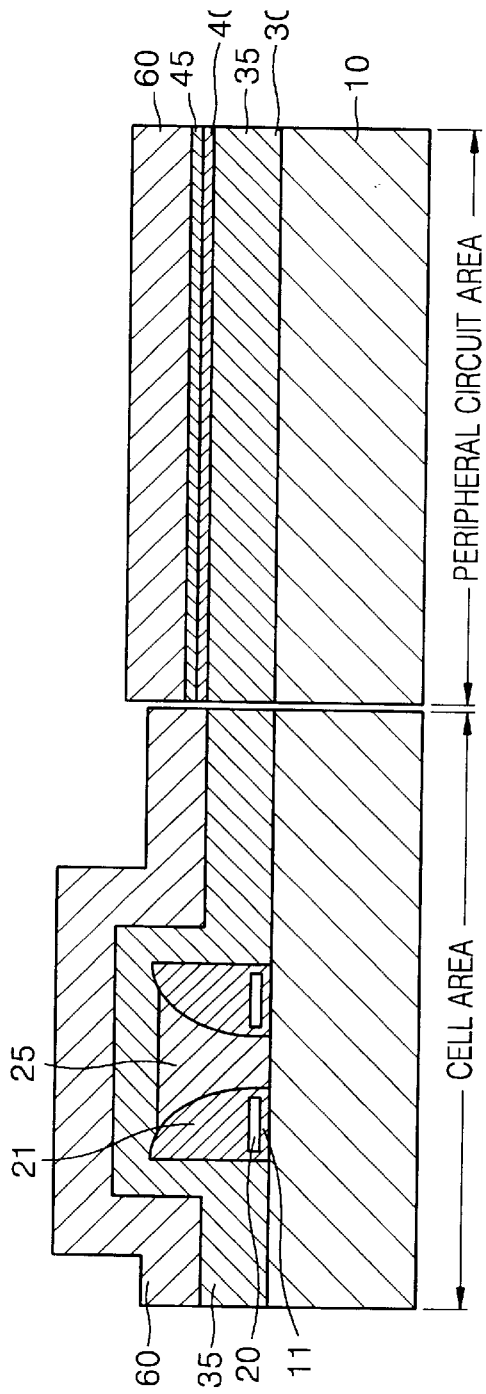
Figure 5:
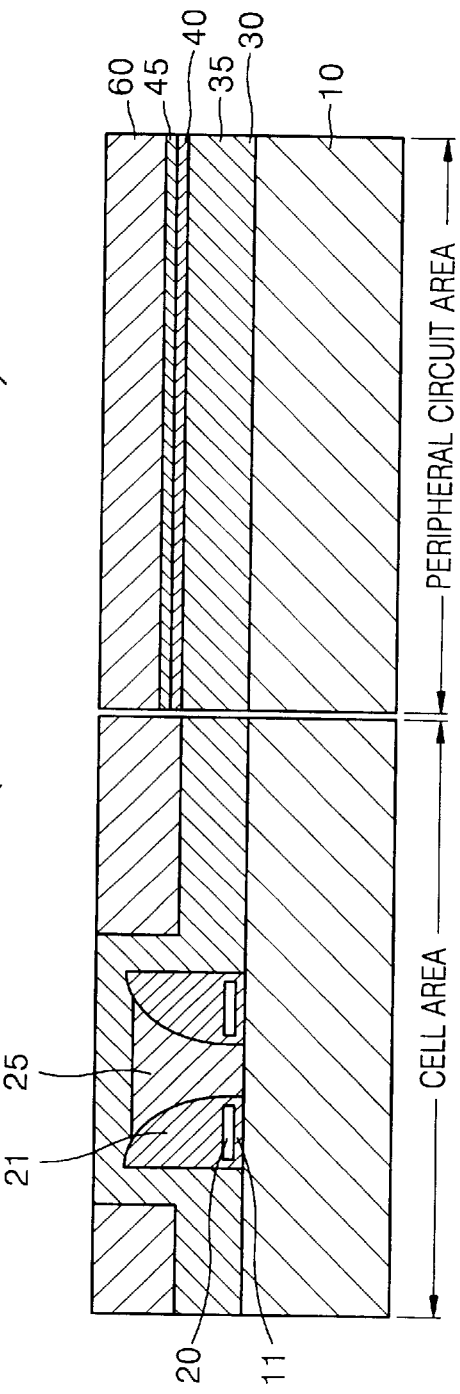
Figure 6:
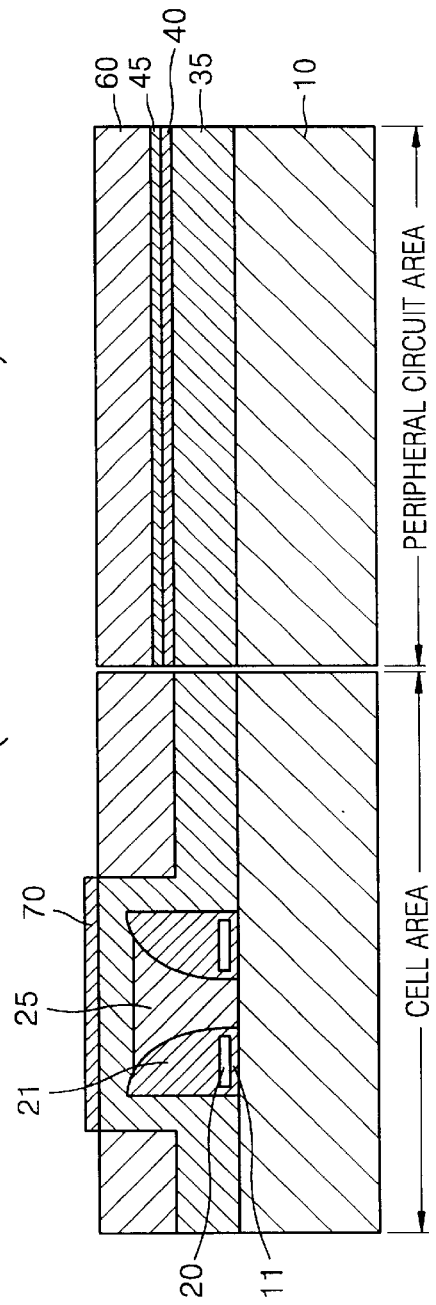
Figure 7:
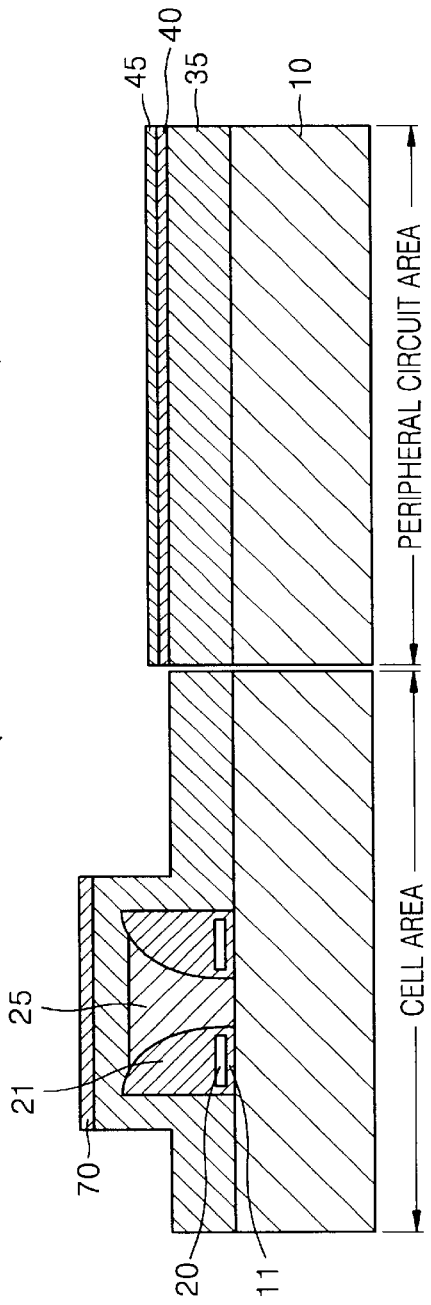

Hereinafter, a method of fabricating a flash memory device according to the present invention will be described with reference to the attached drawings. The same reference numerals are used to designate like elements throughout the drawings.

Referring now to FIGS. 10–18, a substrate 100 is divided into a cell area and a peripheral circuit area. A gate oxide layer (not shown) is re-grown on the entire surface of the substrate 100. A pad oxide layer 111, a floating gate 120, an inter-gate insulating layer 121, and a common source line 125 are formed in the cell area. The floating gate 120 and the inter-gate insulating layer 121 constitute a stepped pattern. As shown in the figures, the stepped pattern may include the common source line 125, as well. A conductive layer 135 and an oxidation-blocking layer 160 are sequentially formed conformally on the stepped pattern. A photoresist layer 165 is formed on the resultant structure (Step 100, as shown in FIG. 11).

The conductive layer 135 is formed of polysilicon to a thickness of 1500–2500 Å, and preferably to a thickness of 2000 Å. A nitride (SiN) layer or an oxynitride (SiON) layer is used as the oxidation-blocking layer 160. The nitride layer will be formed to a thickness of 50–100 Å, whereas the oxynitride layer will be formed to a thickness of 50–600 Å. A photoresist layer 165 is formed to a thickness based on a residual layer proportion characteristic of the photoresist (explained below) and the target height of the final photoresist pattern.

Figure 10:
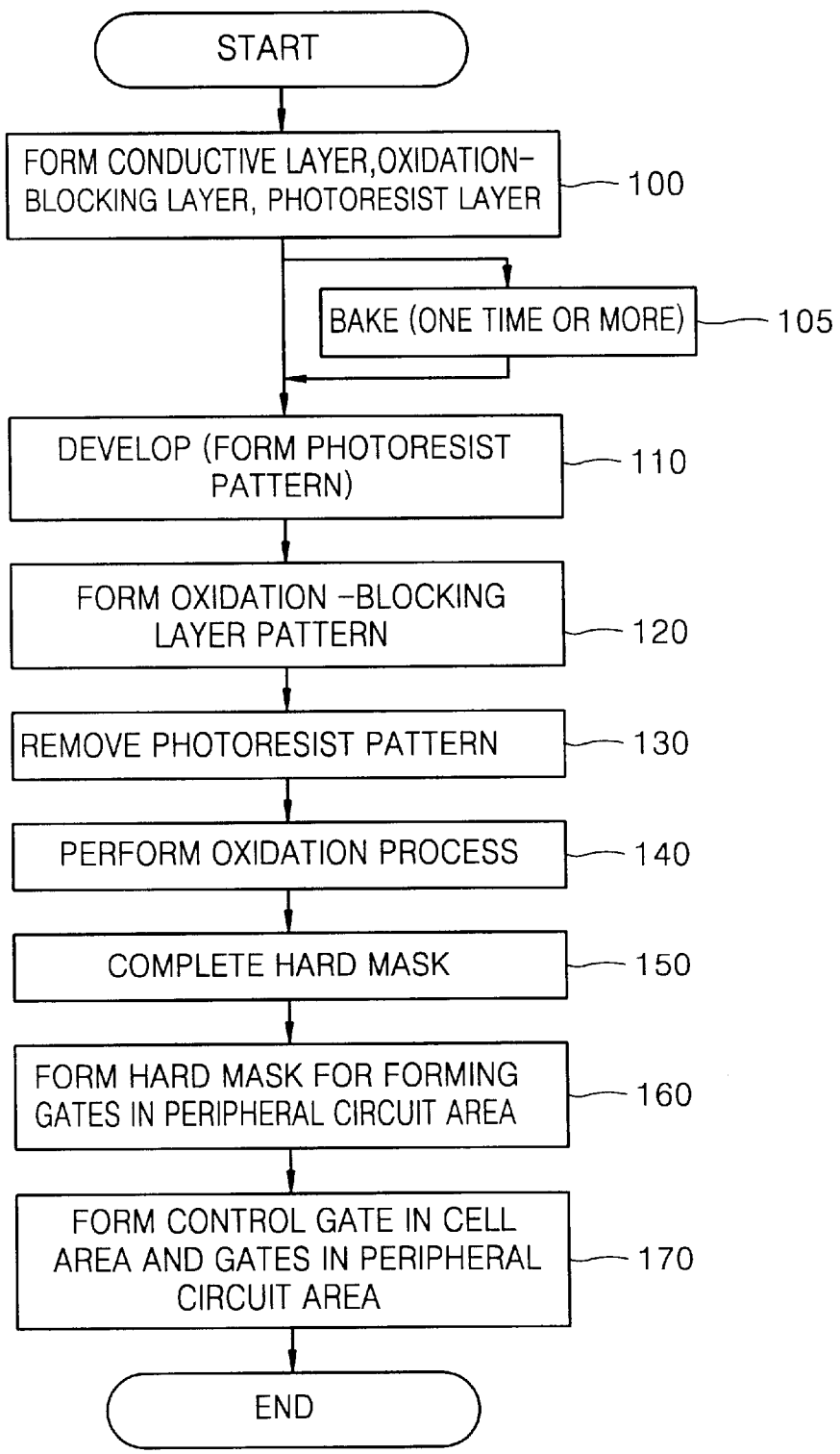
FIG. 10 is a flowchart of a first embodiment of a method of fabricating a flash memory device according to the present invention.

The photoresist layer 165 is treated with a developing solution to form a photoresist pattern 165P that exposes that portion of the oxidation-blocking layer 160 above the stepped pattern (step 110 of FIG. 10 as shown in FIG. 12). The developing step 110 is performed by exposing the photoresist to TMAH of 2.38 wt % for 20–150 seconds, by exposing the photoresist to NaOH or KOH for 20–200 seconds, by exposing the photoresist to methanol or ethanol for 10–200 seconds, or by exposing the photoresist to choline for 20–200 seconds. This developing process is performed until the height of the photoresist pattern 165P is 20–90% of the height of that portion on the conductive layer 135 on the stepped pattern.

Accordingly, the photoresist pattern 165P is self-aligned with the stepped pattern using only a developing solution, i.e., without a photo exposure process. The photoresist pattern 165P can be formed only by a developing process using photoresist having a residual layer proportion characteristic of less than 80%, preferably, 20–80%, and more preferably, 20–50%, because the photoresist layer 165 is formed conformally over the stepped pattern. The residual layer proportion characteristic is a percentage obtained by dividing the thickness of the photoresist pattern 165P (the thickness of the photoresist after being treated with developing solution) by the thickness of the photoresist layer 165 (the thickness of the photoresist before being treated with developing solution) and then multiplying by 100.

To this end, the photoresist may include a first novolak resin and a photoactive compound (PAC) of 3–15 wt % based on the total weight of the first novolak resin.

Any novolak having a developing rate of 500–1000 Å/sec is suitable for use as the first novolak resin. Also, a novolak resin having an average molecular weight of 2000–10000 g/mole and a polydispersity of 2.0–7.0 is preferred.

Examples of the first novolak resin include a phenol novolak resin manufactured by condensing a cresol mixture of m-cresol and p-cresol with formalin in the presence of an oxalic acid catalyst, or a novolak resin manufactured by condensing o-cresol, m-cresol, p-cresol, and 2,4-xylenol with formalin in the presence of an oxalic acid catalyst. A quinonediazid group compound is used as the photoactive compound.

Alternatively, the photoresist may comprise the first novolak resin, a second novolak resin of 10–60 wt % based on the total weight of the first novolak resin and having a rate of dissolution of 300–1500 Å/sec in a developing solution, and a photoactive compound of 15–30 wt % based on the total weight of the first novolak resin; the photoresist may comprise the first novolak resin, polyhydroxystyrene of 10–60 wt % based on the total weight of the first novolak resin, and a photoactive compound of 15–30 wt % based on the total weight of the first novolak resin; or the photoresist may comprise a compound of these photoresist compositions.

A novolak resin having an average molecular weight of 2000–10000 g/mole and a polydispersity of 3.0–7.0 is suitable for use as the second novolak resin. A suitable polyhydroxystyrene has an average molecular weight of 3000–50000 g/mole and a polydispersity of 1.1–3.0.

Baking the photoresist layer 165 increases the solubility of the photoresist layer in a developing solution. Therefore, a baking step 105 may be performed before the developing step 110 to reduce the residual layer proportion characteristic of the photoresist layer 165 to below 80%, and preferably to below 50%. In particular, the baking step 105 is preferably carried out when the photoresist layer 165 is formed of photoresist comprising a polymer having protecting groups combined with a backbone. The polymer is readily de-protected by the baking process such that the solubility of the photoresist layer 165 in the developing solution increases.

For example, when the photoresist layer 165 is formed of photoresist comprising a polymer having a t-butyloxycarbonyl group and an acetal group combined with a backbone of the polymer and a photoacid generator of 0.5–8 wt % based on the total weight of the polymer, baking the photoresist layer 165 can provide the photoresist layer 165 with a residual layer proportion characteristic of less than 80%, preferably 20–80%, and more preferably, 20–50%. In this case, the polymer preferably includes a protecting group of 3–10 wt % based on the total weight of the polymer backbone, and the polymer backbone is polyhydroxy phenol or novolak. However, protecting groups other than those of the t-butyloxycarbonyl group and the acetal group can be used.

The photoresist, preferably, has an average molecular weight of 3000–20000 g/mole and a polydispersity of 1.3–3.5.

In the present invention, the baking step 105 can be performed as a single stage process in which the photoresist layer 165 is baked at a temperature of 130–160° C. for 30–120 seconds or can be performed in two stages, namely, a first stage in which the photoresist layer 165 is baked at 90–120° C. for 30–120 seconds and a second stage in which the photoresist layer 165 is baked at 130–160° C. for 30–120 seconds. The two stage baking process is advantageous when the backbone of the polymer of the photoresist is combined with two or more different protecting groups. In that case, the efficacy of the different protecting groups can be reduced during the different stages of the baking process, respectively, whereby the desired residual layer proportion characteristic can be easily attained.

Next, in step 120, the portion of the oxidation blocking layer 160 exposed by the photoresist pattern 165P, i.e., the portion of the oxidation blocking layer 160 above the stepped pattern, is etched back to form an oxidation blocking layer pattern 160P exposing part of the conductive layer 135, as shown in FIG. 13.

Figure 15:
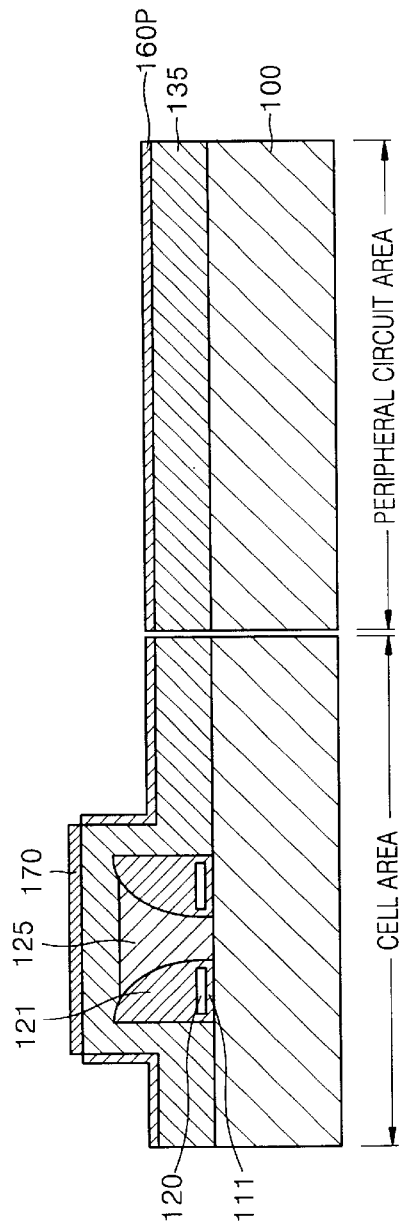

The photoresist pattern 165P is then removed in step 130, as shown in FIG. 14. Next, in step 140, a hard mask 170 is formed by an oxidation process, as shown in FIG. 15. In this step, only the surface of the conductive layer 135 exposed by the blocking layer pattern 160P is oxidized. Thus, a hard mask 170, defining a control gate accurately aligned with the floating gate 120, is formed without a photolithography process. The oxidation process is performed such that the hard mask 170 is thick enough to serve as a mask during a subsequent etch process for forming the control gate.

Figure 16:
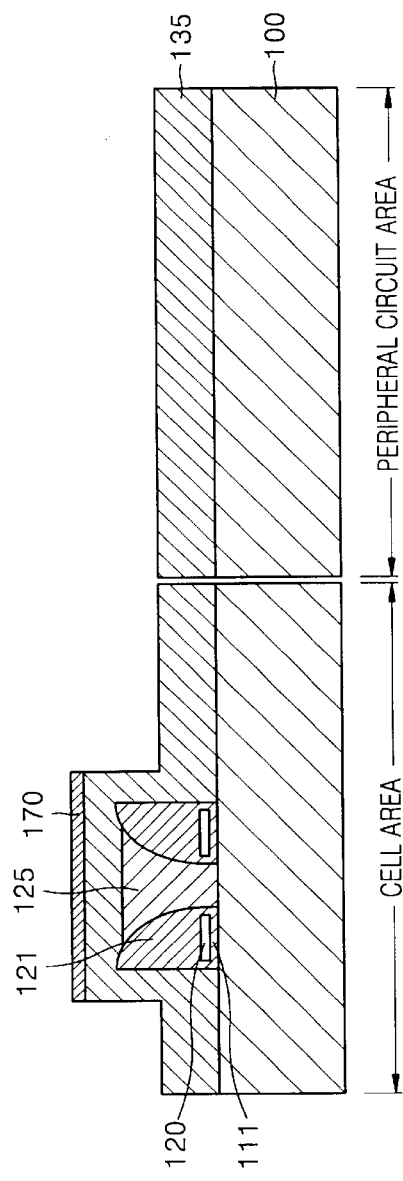

The oxidation blocking layer pattern 160P is removed in step 150, as shown in FIG. 16. In this step, the oxidation blocking layer pattern 160P is removed by a typical phosphoric acid stripping or wet etching process.

A nitride layer and an anti-reflective layer are formed on the entire surface of the substrate 100. Then, in step 160, hard masks 185 defining gate patterns are formed by a conventional photolithography process in the peripheral circuit area, as shown in FIG. 17.

Finally, in step 170, the conductive layer 135 is etched using the hard mask 170 in the cell area, and the hard masks 185 in the peripheral circuit area. As a result, a control gate 190 is formed in the cell area and gates 195 are formed in the peripheral circuit area, as shown in FIG. 18.

FIGS. 19 and 20 illustrate a second embodiment of the method of fabricating a flash memory device according to the present invention. As shown in FIG. 19, the same steps as those of the first embodiment are performed up to the step of forming a photoresist layer 165. In the second embodiment, the photoresist layer 165 is dissolved by a developing process until the height H of that portion of the photoresist layer 165A remaining on the stepped pattern is equal to or less than 10% of the height of the conductive layer 135.

The photoresist layer 165A remaining on the stepped pattern is removed by a photoresist etch back process to form a photoresist pattern 165P that exposes that portion of the oxidation blocking layer 160 on the stepped pattern, as shown in FIG. 20. The subsequent steps are the same as those described with respect to the first embodiment.

In the second embodiment, the photoresist pattern 165P is not formed by only a developing process. Rather, the photoresist pattern 165P is formed by developing to some extent the photoresist layer 165A on the stepped pattern, and then etching back the remaining photoresist layer 165A. This technique provides an increased process margin compared to the case of forming the photoresist pattern only by a developing process.

The present invention will be explained in more detail with reference to the following studies. However, the present invention should not be construed as being limited to the examples used in these studies.

<1: Dependence between the Content of Photoactive Compound and the Residual Layer Proportion Characteristic>

A phenol novolak resin composed by condensing a cresol compound, in which m-cresol and p-cresol are mixed at a ratio of 30:70 with formalin under an oxalic acid catalyst, was dissolved with a photoactive compound in a propylene glycol monoethyl acetate (PGMEA) to prepare photoresist. A compound manufactured by reacting 1,2-naphthoquinone-2-diazide-5-sulfonylchloride and 1,1,1-tri(4-hydroxyphenyl)ethane with 1,4-dioxane under a triethylamine catalyst was used as the photoactive compound.

Here, five batches of photoresist having respective different photoactive compound weight ratios of 7 wt %, 11 wt %, 16 wt %, 19 wt %, and 22 wt % to the total weight of the photoresist were prepared.

After photoresist having a photoactive compound weight ratio of 7 wt % was coated on 4 substrates to a thickness of 6000 Å, the substrates were dipped into a TMAH developing solution of 2.38 wt % for 20 seconds, 40 seconds, 60 seconds, and 80 seconds, respectively. Then, the thickness of the remaining photoresist layer was measured. Experiments were conducted on the photoresists having the other weight ratios of the photoactive compounds, under the same experimental conditions. The results are illustrated in FIG. 21.

Figure 21:
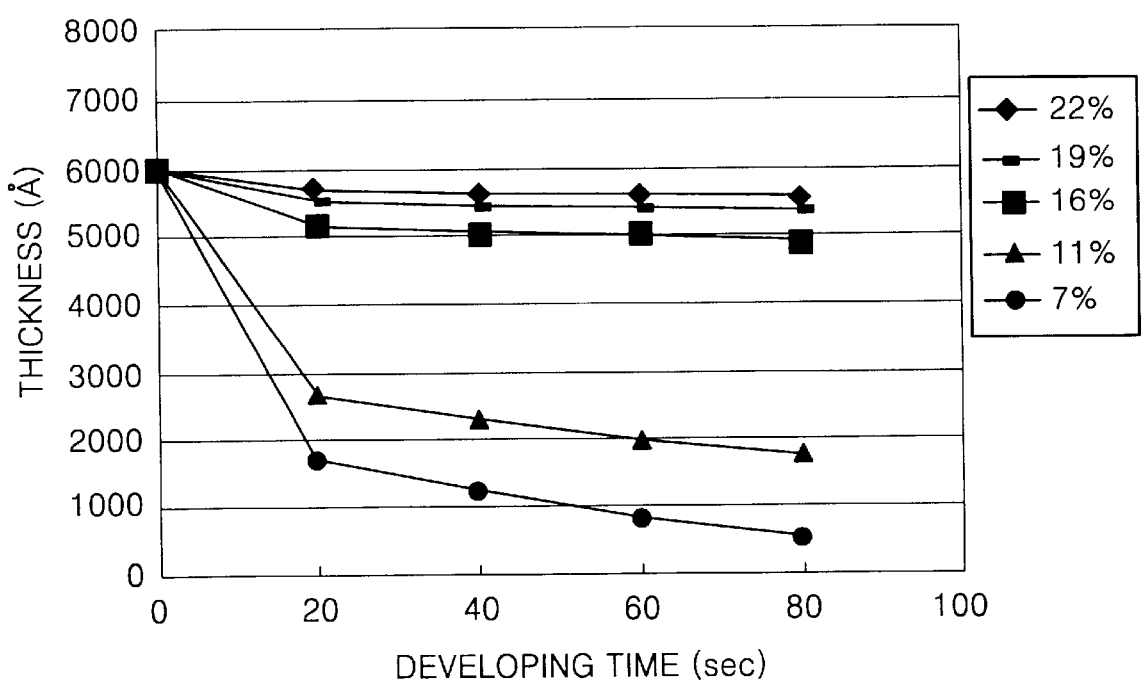
FIG. 21 is a graph illustrating a relationship between the residual layer proportion characteristic of a photoresist layer and the content of a photoactive compound.

As is clear from the results shown in FIG. 21, in the case of the photoresist having a photoactive compound weight ratio of less than 16%, the residual layer proportion characteristic is equal to or less than 50% when the developing process is performed for at least 20 seconds. Also, as long as the developing process is performed for more than 20 seconds, the residual layer proportion characteristic is less than 30%.

<2: Relationship between the Developing Time and the Residual Layer Proportion Characteristic>

Ten different substrates were coated to a thickness of 10,000 Å with photoresist manufactured by the same method as in study 1, and having a photoactive compound weight ratio of 10 wt %. The substrates were soaked in a TMAH developing solution of 2.38 wt % for 10 seconds, 20 seconds, 30 seconds, 40 seconds, 50 seconds, 60 seconds, 70 seconds, 80 seconds, 90 seconds, and 100 seconds, respectively. The thicknesses of the photoresist layers remaining after the developing process were measured. The results are illustrated in FIG. 22.

Figure 22:
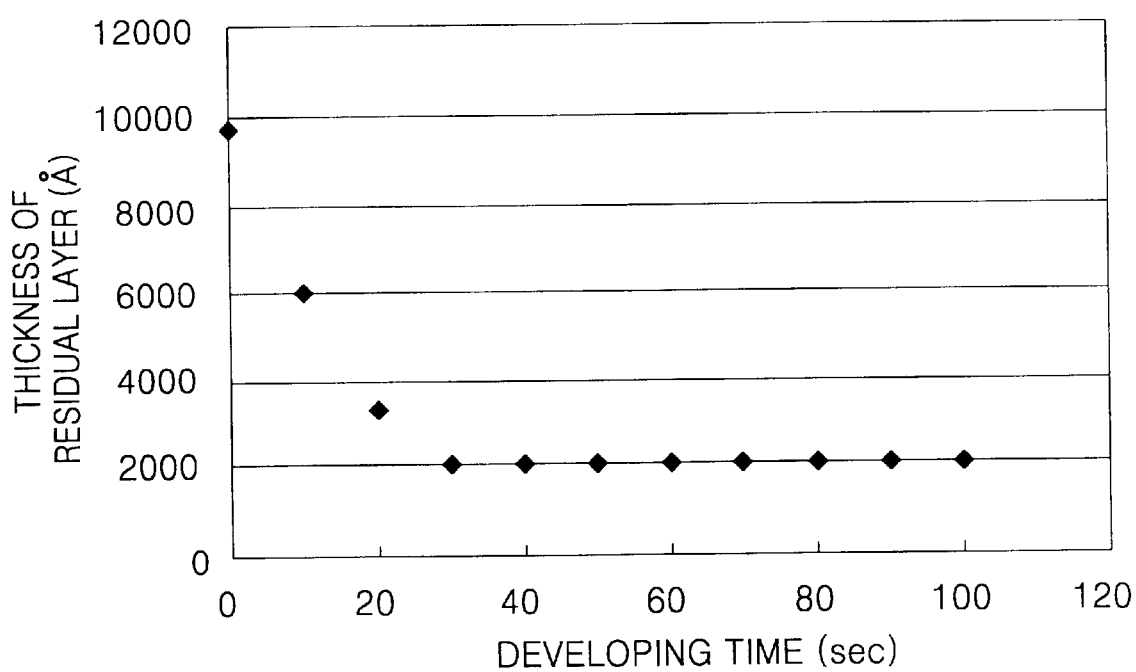
FIG. 22 is a graph illustrating a relationship between the residual layer proportion characteristic of a photoresist and developing time.

As is clear from the results shown in FIG. 22, the thickness of the photoresist layer decreases rapidly reduced for up to 30 seconds after the developing process begins. After 30 seconds, the residual layer proportion characteristic remains the same. Therefore, the photoresist used in the present invention differs from a conventional photoresist in which the residual layer proportion characteristic remains higher than 90%. However, after a predetermined time in the developing solution, the photoresist used in the present invention maintains a uniform residual layer proportion characteristic.

<3: Affect of Baking Temperature on the Residual Layer Proportion Characteristic>

Figure 23:
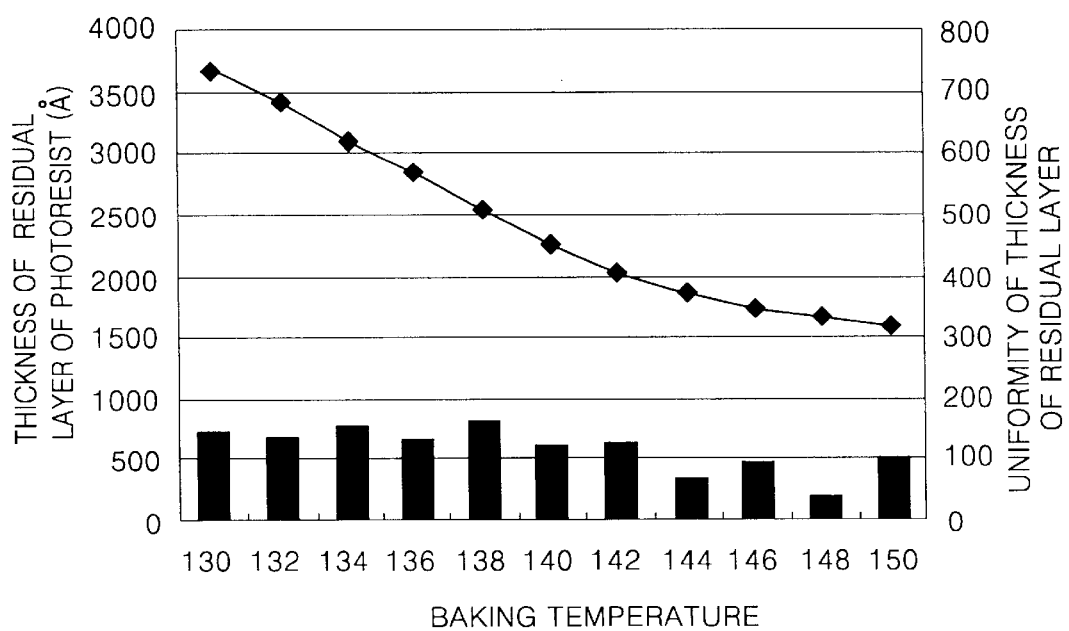
FIG. 23 is a graph of the thickness of a photoresist residual layer and the uniformity in residual layer thickness with respect to the baking temperature of a photoresist layer formed of a polymer including a t-butyloxycarbonyl group and an acetal group as a protecting group.

A plurality of samples were coated with a 6700 Å thick layer of photoresist formed of a polymer including a t-butyloxycarbonyl group and an acetal group as a protecting group combined with a polyhydroxyphenol backbone. These samples were baked for 90 seconds at different baking temperatures and treated with a developing solution of 2.38 wt %. Then, the residual layer proportion characteristic was measured. As shown in FIG. 23, when the samples were baked at a temperature of 130–150° C., the residual layer proportion characteristic was 55–23%. In particular, the residual layer proportion characteristic was equal to or less than 30% at a temperature equal to or greater than 142° C. Also, the residual layer proportion characteristic of the photoresist of the plurality of samples was measured with respect to the respective baking temperatures, and the uniformity of the residual layer proportion characteristic was quantified. The results showed (see the bar graph in the figure) that a uniformity equal to or less than 200 Å was maintained. In particular, a uniformity of the residual layer proportion characteristic was equal to or less than 100 Å at a temperature equal to or greater than 142° C. Such a uniformity is quite satisfactory.

<4: Thermogravimetric Analysis of Photoresist with Respect to the Baking Temperature>

Figure 24:
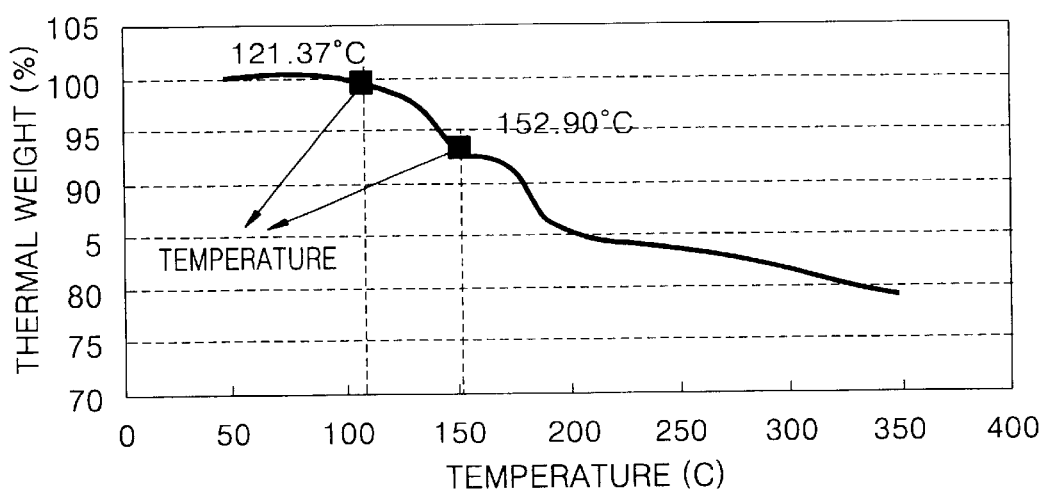
FIG. 24 is a temperature-to-thermogravimetric analysis (TGA) graph of photoresist formed of a polymer including a t-butyloxycarbonyl group and an acetal group as a protecting group.

In order to investigate characteristics of the photoresist used in study 3, the thermal weight was measured with respect to the different baking temperatures. The results are illustrated in FIG. 24.

These results show that there is a tendency for the thermal weight to abruptly decrease once the baking temperature rises above 121.37° C. and again at 152.90° C. Therefore, the efficacy of the protecting groups must be decreased to attain a satisfactory residual layer proportion characteristic, i.e., the polymer must be de-protected. Note, the photoresist used in this study included two different protecting groups; therefore, in this case, a two-stage baking process is better-suited than a one-stage baking process for decreasing the residual layer proportion characteristic.

<5: Thermogravimetric Analysis of the Photoresist with Respect to the Baking Temperature>

In order to determine the conditions of the two-stage baking process necessary for producing the desired residual layer proportion characteristic in the photoresist layer used in study 3, three substrates coated with the photoresist were baked at the baking temperatures and for times listed in the following table.

| Sample | First Stage of Baking | | Second Stage of Baking | |
|---|---|---|---|---|
|  | Temperature (° C.) | Time (sec) | Temperature (° C.) | Time (sec) |
| 1 | 120 | 150 | 136 | 130 |
| 2 | 120 | 150 | 138 | 130 |
| 3 | 120 | 150 | 142 | 130 |

Figure 25:
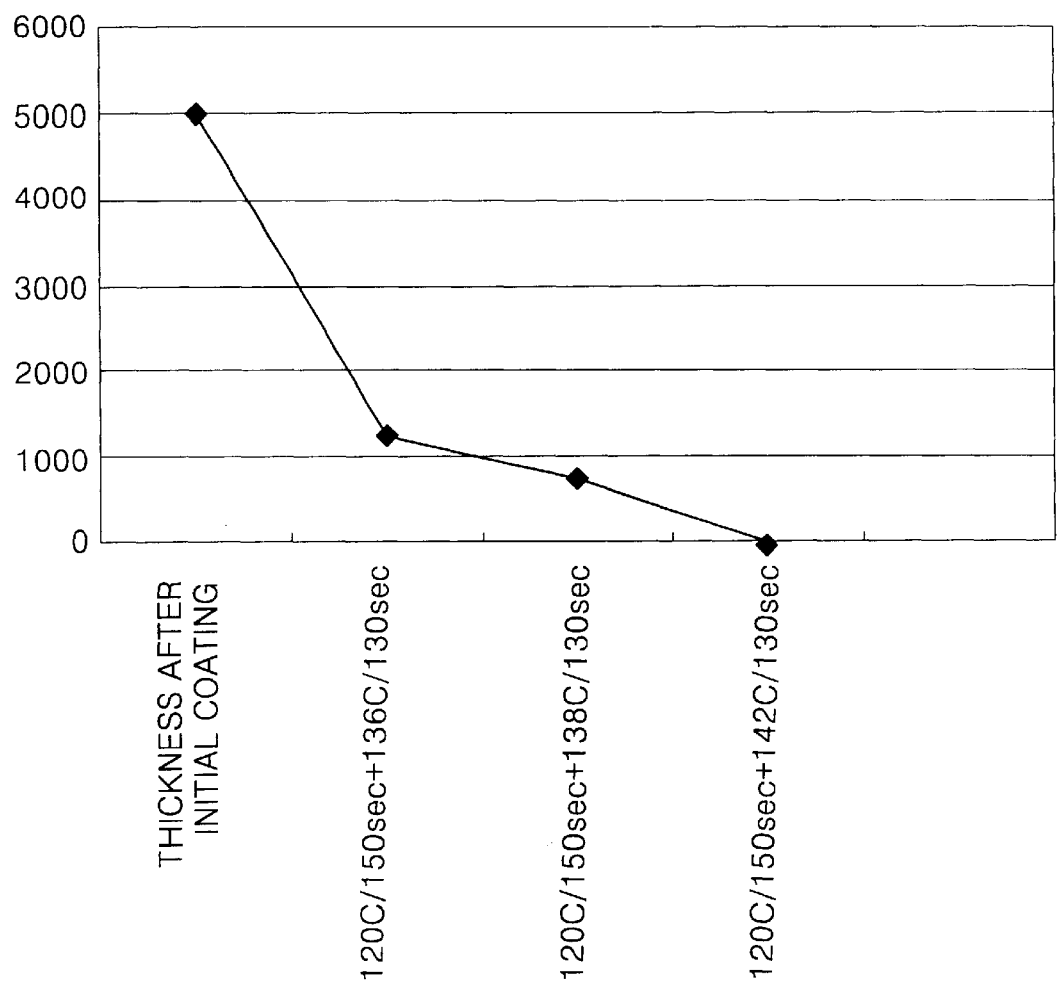
FIG. 25 is graph illustrating the residual layer proportion characteristic with respect to first and second baking temperatures and baking times of photoresist formed of a polymer including a t-butyloxycarbonyl group and an acetal group as a protecting group.

The results of these baking processes are illustrated in FIG. 25. The results confirm that the desired residual layer proportion characteristic can be attained by baking the photoresist in multiple stages of certain temperatures and times.

According to the present invention, a hard mask defining a control gate pattern is formed in a cell area by a self-aligned non-exposure pattern formation process in which a photoresist pattern self-aligned with respect to a stepped pattern is used. The self-aligned photoresist pattern is formed of photoresist provided with a desired residual layer proportion characteristic, and by patterning the photoresist without the use of a photo exposure process.

In particular, a photoresist having a residual layer proportion characteristic equal to or less than 80%, and preferably less than 50%, is formed on a stepped underlayer, and the photoresist layer is soaked in a developing solution, whereby the portion of the photoresist layer that covers the stepped underlayer is dissolved by the developing solution. Therefore, the process is relatively simple.

Also, the method of the present invention completely avoids the possibility of the misalignment errors associated with the conventional exposure process, which errors become more prevalent the smaller the design rule becomes. Also, an anti-reflection layer for preventing irregular reflection is not required because an exposure process is not used. Thus, a highly integrated stacked gate structure in a flash memory cell can be formed by a very simple and accurate process. Accordingly, compared to the conventional method of fabricating a flash memory cell that includes a self-aligned CMP process, the fabrication of a flash memory device of the present invention is more economical, generates less waste, and can be executed by a simpler system. Also, in the present invention, the photolithography required by the conventional self-aligned CMP process for opening a cell area, is omitted.

Finally, although the present invention has been described above with respect to the preferred embodiments thereof, the invention maybe embodied in other forms as will become apparent to those of ordinary skill in the art. Therefore, the true spirit and scope of the present invention is defined by the appended claims.

What is claimed is:

1. A method of fabricating a flash memory device, comprising:

forming a conductive layer and an oxidation-blocking layer on a stepped pattern, including a floating gate pattern and an inter-gate insulating layer pattern, such that the conductive layer and the oxidation-blocking layer conform to said stepped pattern;

forming a photoresist layer on the oxidation-blocking layer, whereby the photoresist layer has an upper surface situated above the oxidation-blocking layer;

dissolving a portion of the photoresist layer, without having photo-exposed the photoresist layer, until the upper surface thereof is situated below the upper surface of that part of the oxidation-blocking layer disposed directly above the stepped pattern, and thereby forming a photoresist pattern that exposes part of the oxidation-blocking layer, said dissolving comprising soaking the photoresist layer in a developing solution;

removing the part of the oxidation-blocking layer exposed by the photoresist pattern to form an oxidation-blocking layer pattern that exposes that part of the conductive layer disposed directly above the stepped pattern;

removing the photoresist pattern;

oxidizing the surface of the conductive layer exposed by the oxidation-blocking layer pattern to thereby form a hard mask defining a control gate;

subsequently removing the oxidation-blocking layer pattern;

etching the conductive layer using the hard mask as an etch mask to thereby form a control gate; and subsequently removing the hard mask.

2. The method of claim 1, wherein said dissolving of the portion of the photoresist layer comprises:

dissolving the photoresist layer with a developing solution until the photoresist layer is left with a height equal to or less than 10% of the height of that part of the conductive layer disposed directly over the stepped pattern; and subsequently etching back the photoresist layer on the stepped pattern.

3. The method of claim 2, wherein said dissolving of the portion of the photoresist layer is carried out until the height of the photoresist pattern is 20–90% of the height of that part of the conductive layer disposed directly over the stepped pattern.

4. The method of claim 1, wherein forming the oxidation blocking layer comprises forming a nitride layer to a thickness of 50–100 Å or an oxynitride layer to a thickness of 50–600 Å.

5. The method of claim 1, in which the substrate has a cell area and a peripheral circuit area, and the stepped pattern is formed in the cell area, and further comprising:

forming additional hard masks on the conductive layer in the peripheral circuit area after the hard mask defining the control gate is formed, and wherein said etching of the conductive layer simultaneously uses the hard mask in the cell area and the additional hard masks in the peripheral circuit area as etch masks to form the control gate in the cell area and gates in the peripheral circuit area.

6. The method of claim 1, wherein the photoresist layer is formed of photoresist including a first novolak resin and a photoactive compound of 3–15 wt % based on the total weight of the first novolak resin.

7. The method of claim 1, wherein the photoresist layer is formed of photoresist including a first novolak resin, a second novolak resin of 10–60 wt % based on the total weight of the first novolak resin and having a rate of dissolution in the developing solution of 300–1500 Å/sec, and a photoactive compound of 15–30 wt % based on the total weight of the first novolak resin.

8. The method of claim 1, wherein the photoresist layer is formed of photoresist including a first novolak resin, polyhydroxystyrene of 10–60 wt % based on the total weight of the first novolak resin, and a photoactive compound of 15–30 wt % based on the total weight of the first novolak resin.

9. The method of claim 6, wherein the first novolak resin has an average molecular weight of 2000–10000 g/mole, and a polydispersity of 2.0–7.0.

10. The method of claim 7, wherein the first novolak resin has an average molecular weight of 2000–10000 g/mole, and a polydispersity of 2.0–7.0.

11. The method of claim 8, wherein the first novolak resin has an average molecular weight of 2000–10000 g/mole, and a polydispersity of 2.0–7.0.

12. The method of claim 8, wherein the polyhydroxystyrene has an average molecular weight of 3000–50000 g/mole, and a polydispersity of 1.1–3.0.

13. The method of claim 6, wherein the photoactive compound is a quinonediazide compound.

14. The method of claim 7, wherein the photoactive compound is a quinonediazide compound.

15. The method of claim 8, wherein the photoactive compound is a quinonediazide compound.

16. The method of claim 1, further comprising baking the substrate on which the photoresist layer is formed before the photoresist layer is soaked in the developing solution.

17. The method of claim 16, wherein said baking is performed at 130–160° C. for 30–120 seconds.

18. The method of claim 16, wherein said baking comprises first baking the substrate at 90–120° C. for 30–120 seconds and then baking the substrate at 130–160° C. for 30–120 seconds.

19. The method of claim 16, wherein the photoresist layer is formed of photoresist including a polymer, in which a t-butyloxycarbonyl group and an acetal group are combined with a backbone of the polymer as a protecting group, and a photoacid generator of 0.5–8 wt % based on the total weight of the polymer.

20. The method of claim 19, wherein in the protecting group is 3–10 wt % based on the total weight of the backbone of the polymer.

21. The method of claim 19, wherein the backbone of the polymer is a resin selected from the group consisting of polyhydroxy phenol and novolak.

22. The method of claim 19, wherein the photoresist has an average molecular weight of 3000–20000 g/mole and a polydispersity of 1.3–3.5.

23. The method of claim 1, wherein said dissolving of a portion of the photoresist layer is carried out at a rate of 500–1000 Å/sec.

24. The method of claim 23, wherein said soaking of the photoresist layer in a developing solution comprises soaking the photoresist layer in a TMAH developing solution of 2.38 wt % for 20–150 seconds.

25. The method of claim 23, wherein said soaking of the photoresist layer in a developing solution comprise soaking the photoresist layer in a solution of NaOH or KOH for 20–200 seconds.

26. The method of claim 23, wherein said soaking of the photoresist layer in a developing solution comprises soaking the photoresist layer in methanol or ethanol for 10–200 seconds.

27. The method of claim 23, wherein said soaking of the photoresist layer in a developing solution comprises soaking the photoresist layer in a choline developing solution for 20–200 seconds.

* * * * *

UNITED STATES PATENT AND TRADEMARK OFFICE
CERTIFICATE OF CORRECTION

PATENT NO.    : 6,620,690 B2
DATED         : September 16, 2003
INVENTOR(S)   : Durcan et al.

It is certified that error appears in the above-identified patent and that said Letters Patent is hereby corrected as shown below:

Column 11,
Line 27, replace "dielectric; wherein" with -- dielectric; and wherein --

Column 12,
Line 35, replace "allow capacitor coupling" with -- allow capacitive coupling --

Signed and Sealed this

Sixteenth Day of December, 2003

JAMES E. ROGAN
*Director of the United States Patent and Trademark Office*